United States Patent
Chang et al.

(10) Patent No.: US 6,256,232 B1
(45) Date of Patent: Jul. 3, 2001

(54) DATA ACCESS METHOD CAPABLE OF REDUCING THE NUMBER OF ERASING TO FLASH MEMORY AND DATA PATCH AND ACCESS DEVICE USING THE SAME

(75) Inventors: Li-Pin Chang; Tzao-Lin Lee; Hsiao-Hui Chen; Huey Cheng, all of Taipei (TW)

(73) Assignee: Institute for Information Industry (TW)

( * ) Notice: Subject to any disclaimer, the term of this patent is extended or adjusted under 35 U.S.C. 154(b) by 0 days.

(21) Appl. No.: 09/612,631

(22) Filed: Jul. 7, 2000

(51) Int. Cl.⁷ .................................................. G11C 7/00
(52) U.S. Cl. ................ 365/185.33; 365/185.29; 395/500; 711/6
(58) Field of Search ................ 365/185.33, 185.01, 365/185.29; 395/500; 711/6

(56) References Cited

U.S. PATENT DOCUMENTS 5,668,976 * 9/1997 Zook ...................................... 395/500
6,016,530 * 1/2000 Auclair et al. ........................... 711/6

* cited by examiner

Primary Examiner—Vu A. Le
(74) Attorney, Agent, or Firm—Lowe Hauptman Gilman & Berner, LLP

(57) ABSTRACT

A data access method capable of reducing the number of erasing to flash memory and a data patch and access device that utilizes the method are disclosed. A data write procedure is provided for determining a difference between data to be written and existed data in the data block when writing data to a data block of the flash memory, and if the difference is less than a pre-determined value, writing the difference to a patch area instead of writing the data to the data block. A data read procedure is provided for searching the difference recorded in the patch area when reading data from a data block of the flash memory, so as to patch the data.

18 Claims, 7 Drawing Sheets

DATA ACCESS METHOD CAPABLE OF REDUCING THE NUMBER OF ERASING TO FLASH MEMORY AND DATA PATCH AND ACCESS DEVICE USING THE SAME

BACKGROUND OF THE INVENTION

1. Field of the Invention

The present invention relates to the field of flash memory and, more particularly, to a data access method capable of reducing the number of erasing to flash memory and a data patch and access device that utilizes the method.

2. Description of Related Art

Currently, the flash memory is in wide spread use to emulate a hard disk drive in embedded system application since flash memory can preserve the content thereof when the power is turned off. As shown in FIG. 9, the flash memory 911 and the hard disk emulator 912 constitute the emulation hard disk drive 91. As such, the application system can perform read and write operations to the flash memory just like to a hard disk drive, such that the existing file system can work on it.

The use of the emulation hard disk drive emulated by flash memory is restricted by the characteristic of the flash memory. That is, although the flash memory can be read/written multiple times, it is required to erase the memory area before writing data thereto. The memory erase operation is processed by a physical segment. The number of erasing to a segment is limited (about 100000 time). Because such a limitation to the flash memory, the lifetime of the emulation hard disk drive is also limited.

To extend the lifetime of the emulation hard disk drive emulated by flash memory, the prior art is to reduce the number of erasing by improving the segment callback strategy. The callback strategy is focused on the time period and frequency of the data in use to avoid taking back the data segment that will be invalid soon. However, this approach neglects that the file system will produce many duplication data. Thus, the performance is poor and needs to be improved. Therefore, there is a need to have a novel design to access flash memory that can mitigate and/or obviate the aforementioned problems.

SUMMARY OF THE INVENTION

The object of the present invention is to provide a data access method capable of reducing the number of erasing to flash memory and a data patch and access device that utilizes the method, such that the lifetime of the flash memory is significantly increased.

With this object in view, the present invention resides in a method for reducing the number of erasing to flash memory. The method comprises: (a) a data write procedure for determining a difference between data to be written and existed data in the data block when writing data to a data block of the flash memory, and if the difference is less than a pre-determined value, writing the difference to a patch area instead of writing the data to the data block; and (b) a data read procedure for searching the difference recorded in the patch area when reading data from a data block of the flash memory, so as to patch the data.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
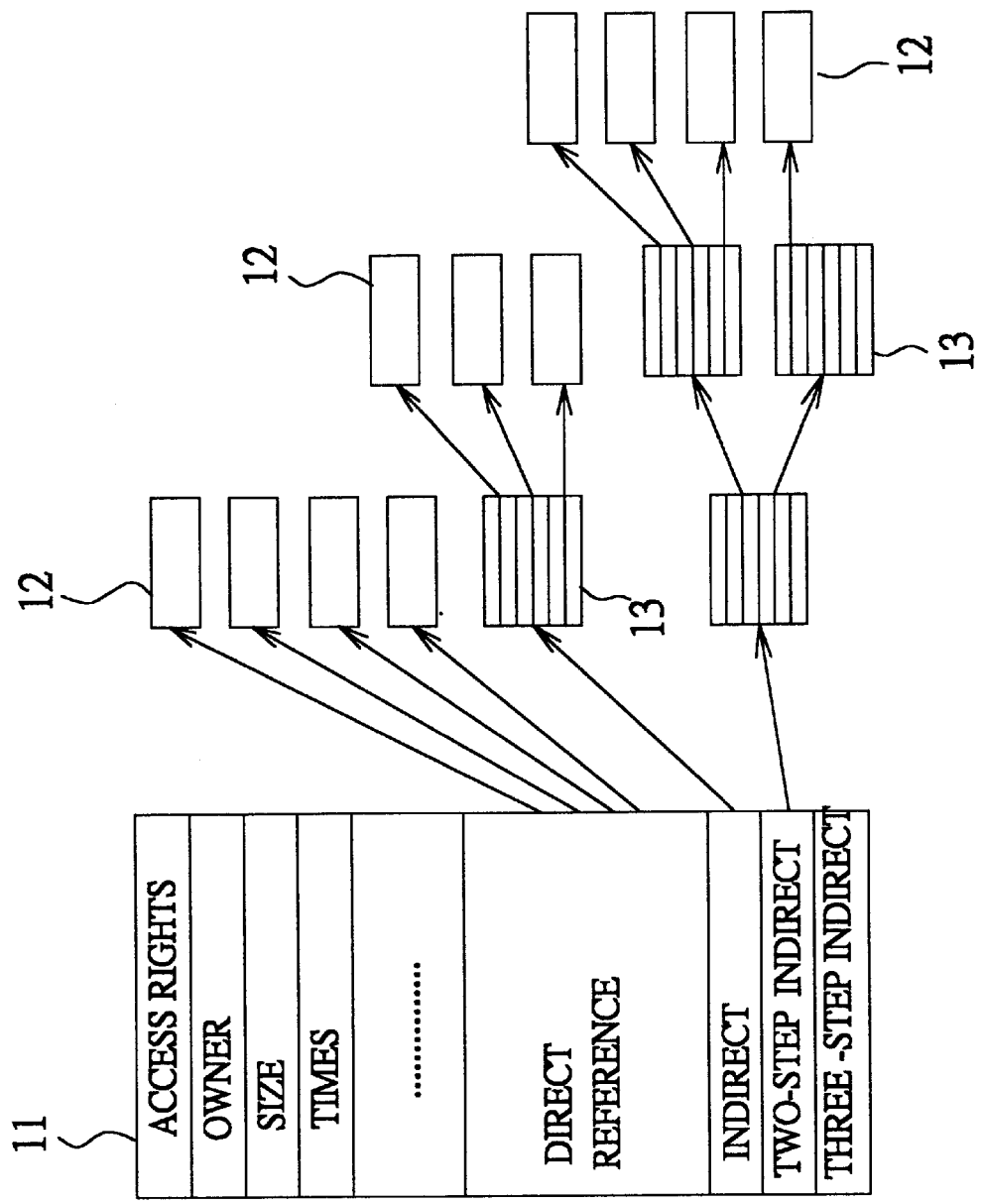
FIG. 1 is the structure diagram of a file system.

Referring now to FIG. 1, there is illustrated a schematic diagram of a general file system, wherein, the index node 11 records information including the access rights, owner, size, times and data index. The data index can directly point to the data block 12 or through the index in indirect block 13 to indirectly point to a data block 12. As such, the file system can access data in unit of block. The data recorded in the data block 12 is known as user data, and the data recorded in the index node 11 or indirect block 13 is known as metadata.

According to the structure of the file system, it is known that updating a file not only writes user data but also writes many metadata which is usually in duplication. The present invention analyses the variance of data and extracts the difference, and the difference is written to a patch area to reduce the number of erasing to flash memory.

Figure 2:
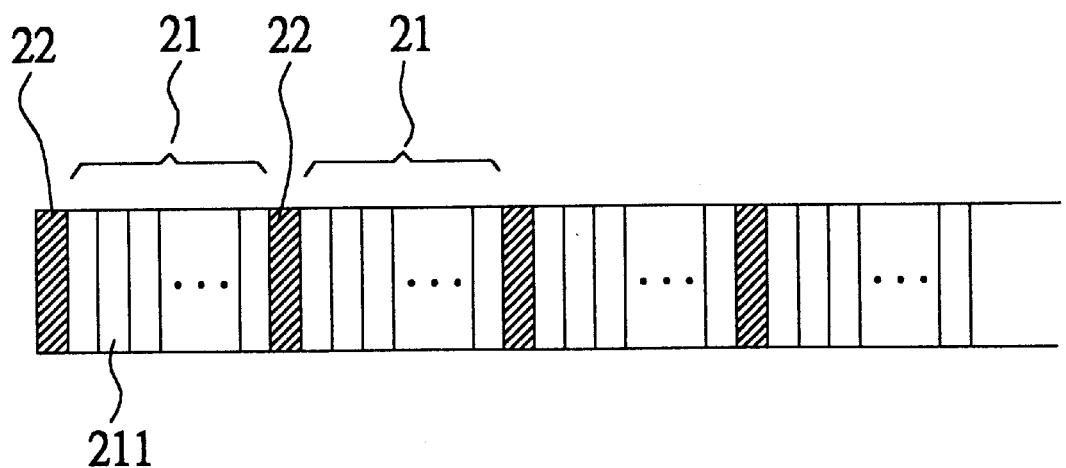
FIG. 2 is flash memory structure diagram in accordance with a preferred embodiment of the present invention.

FIG. 2 illustrates a flash memory structure in accordance with a preferred embodiment of the present invention. It is shown that the flash memory is divided into multiple segments 21, each having a size of, for example, 64~128K byte. In front of each segment 21, there is a patch area 22 corresponding to that segment 21. Every segment 21 is comprised of multiple data blocks 211 which are stored with the accessed data. The patch area 22 is provided to record the variance of the multiple data blocks 211 of the corresponding segment 21.

Figure 3:
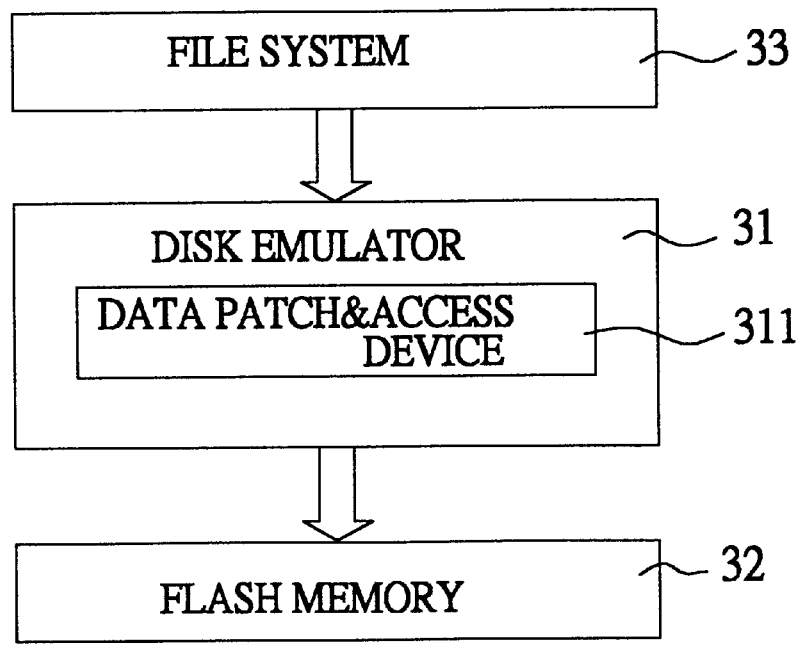
FIG. 3 schematically illustrates an emulation hard disk drive using the data patch and access device of the present invention.

FIG. 3 shows an emulation hard disk drive comprising the data patch and access device of the present invention, wherein the data patch and access device 311 is in the disk emulator 31. When the file system 33 writes data to the flash memory 32, the data patch and access device 311 compares the writing data and the data existed in the corresponding data block 211. If there is no difference, the write operation will not be carried out. If the number of total bytes of the differentiate is less than a predetermined value (i.e. 10% of the size of the data block), the data will not be written to the data block 211 and a patch record is created in the patch area 22 to record the variance. Otherwise, a general flash memory write operation is performed.

When the file system 33 performs a data read operation to the flash memory 32, the data patch and access device 311 searches for corresponding patch records in the patch area 22 based on the data block 211 to be read. If there is no corresponding patch record, the data in the data block 211 is read out directly. Otherwise, the data in the data block 211 is taken out and modified based on the corresponding patch record for being read out to the file system 33.

Figure 4:
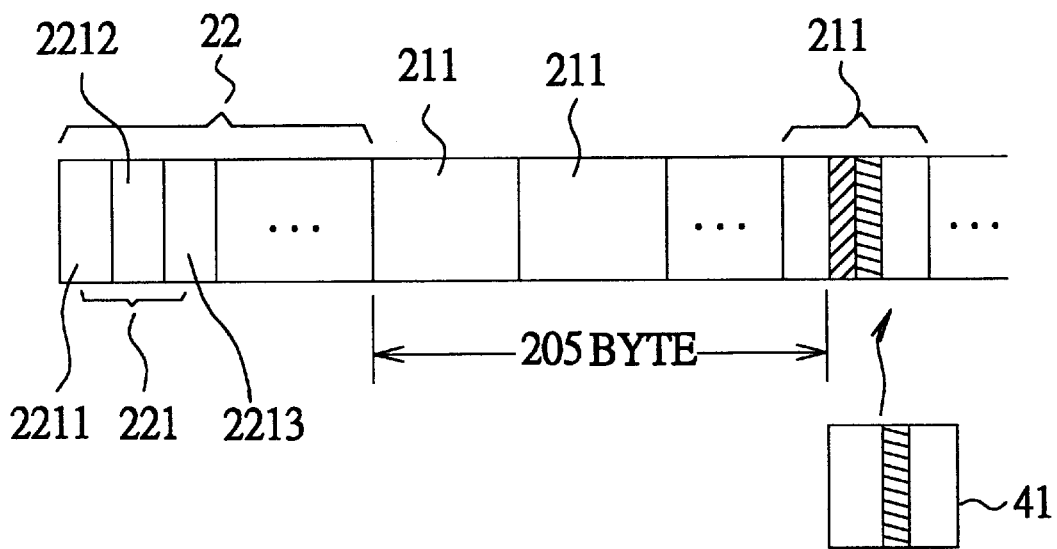
FIG. 4 is an example of the patch area shown in FIG. 3.

FIG. 4 shows an example of the aforementioned patch area 22. As shown, the patch area 22 can be appended with multiple patch records 221, each having a length field 2211, an offset field 2212 and a new data field 2213. It is assumed that the data block 41, which is to be written to block 211 in the segment 21, has only two bytes different from the existed data of the destination data block 211, and the different bytes are the 205th and 206th bytes of the segment 21. The generated patch record 221 has a "2" in the length field 2211, a "205" in the offset field 2212, and two new data bytes in the new data field 2213. On the other hand, when a read operation is performed to the data block 211, in addition to taking out the data, the contents of the length field 2211, offset field 2212 and new data field 2213 of the patch record 221 will also be taken out. The two new data bytes will be patched to the data read from the data block 211, thereby reading out a correct data.

Figure 5:
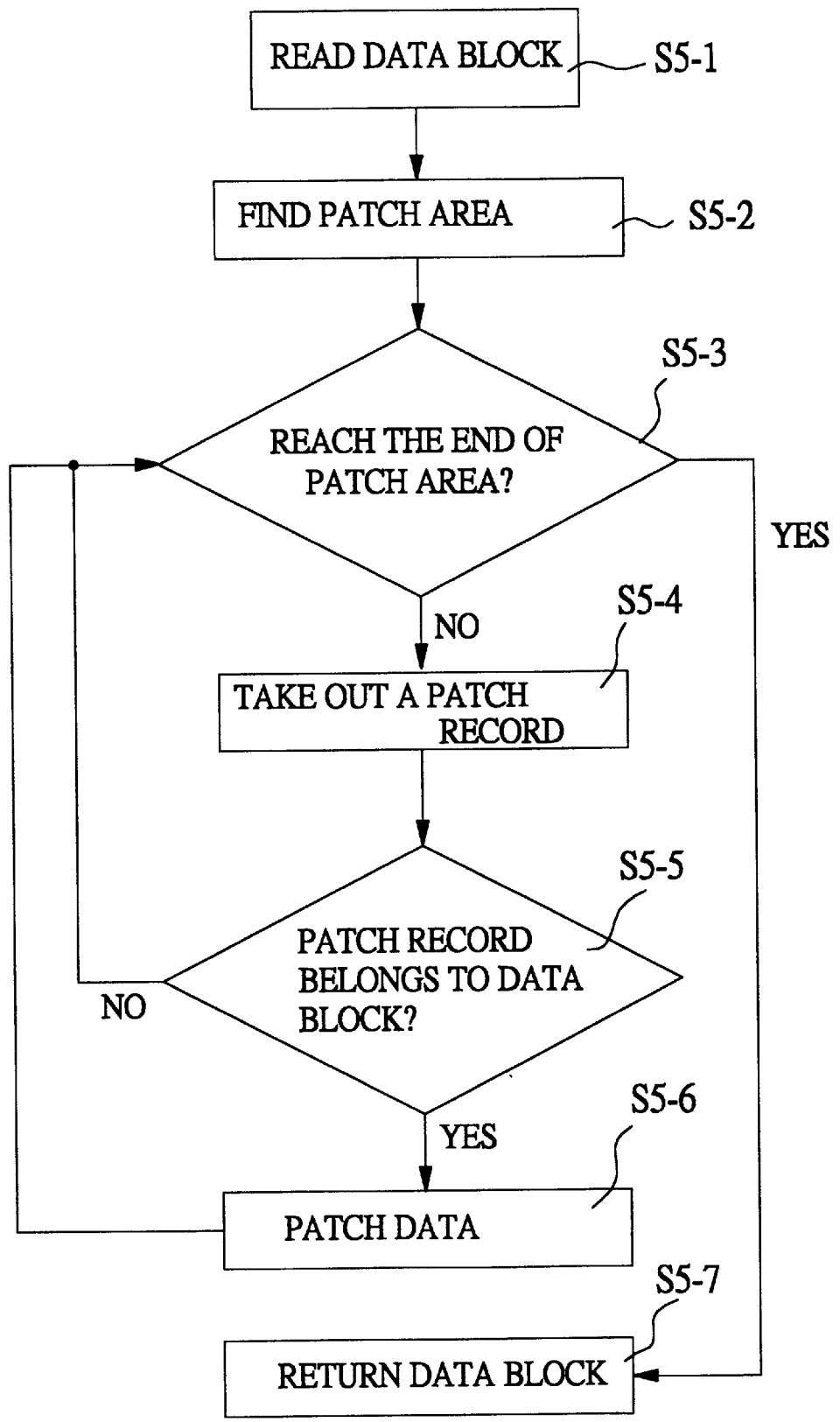
FIG. 5 is an operational flowchart of the data patch and access device 311 for reading data in accordance with the present invention.

The operational flowchart of the data patch and access device 311 for reading data is shown in FIG. 5. First, according to a read instruction, a data block is read out (step S5-1), and the patch area corresponding the data block is found (step S5-2). Next, a judgement is performed to determine whether there is any patch record that has not been taken out (step S5-3); that is, whether the pointer used to taken out the patch record has reached the end of the patch area. If no, a patch record is taken out from the patch area (step S5-4), and a judgement is performed to determine whether the patch record belongs to the data block or not (step S5-5). If no, step S5-3 is executed to determine whether there is a corresponding patch record. If the result in the step S5-5 is yes, it indicates that a corresponding patch record is found. According to the found patch record, the data block is patched with the patch record (step S5-6). Then, step S5-3 is executed again to search whether is another corresponding patch record.

If the result in step S5-3 is yes, it indicates that there is no possibility to have corresponding patch records. Therefore, the data of the patched data block can be returned to complete the read operation (step S5-7).

Figure 6:
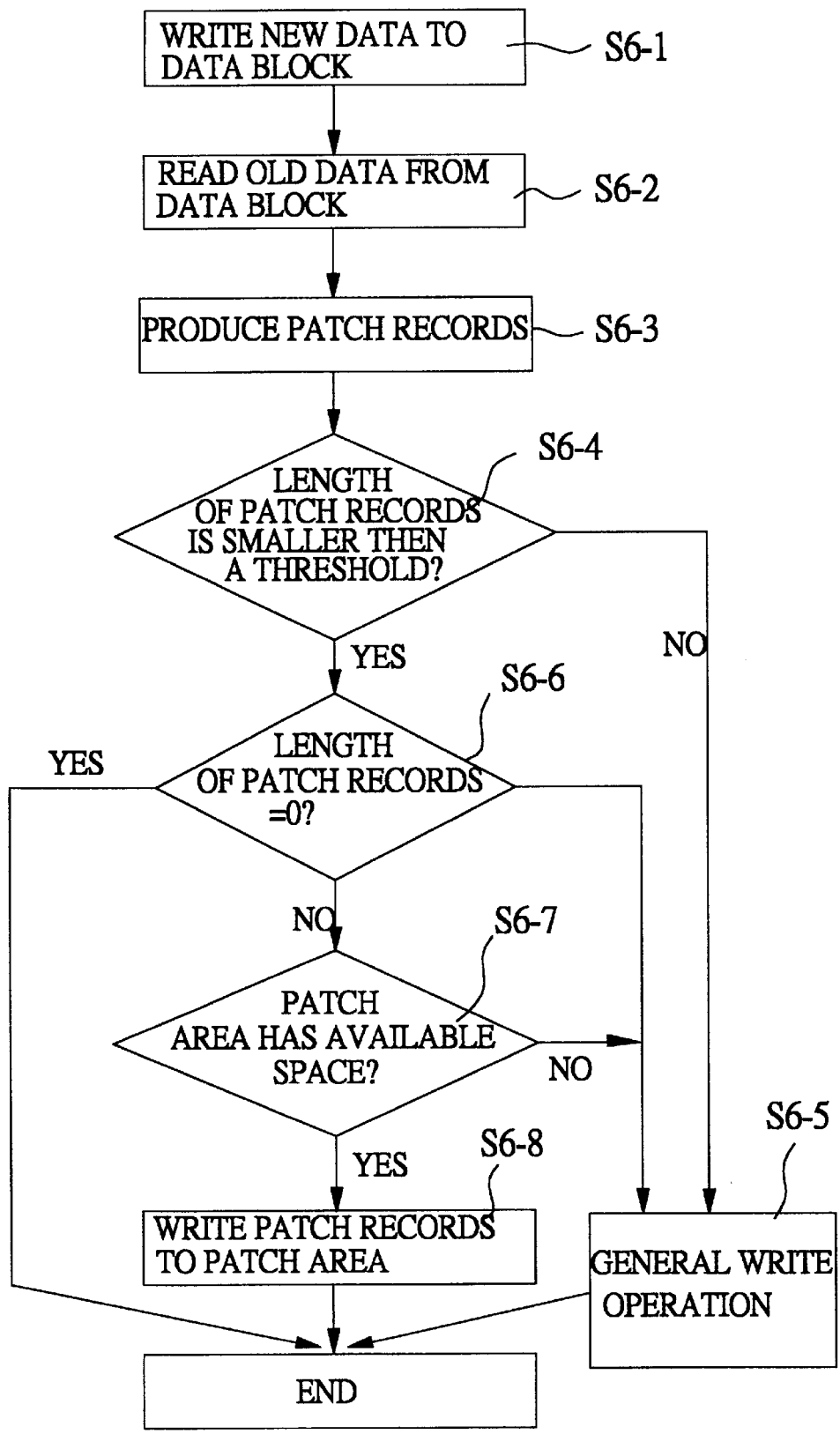
FIG. 6 is an operational flowchart of the data patch and access device 311 for writing data in accordance with the present invention.

The operational flowchart of the data patch and access device 311 for writing data is shown in FIG. 6. As new data is written to a data block (step S6-1), the aforementioned read operation is performed to read the old data in the corresponding data block (step S6-2). The new data and the old data are compared with each other in order to produce one or multiple patch records (step S6-3). A judgment is performed to determine whether the total length of the patch records is less than a predetermined threshold value or not (step S6-4). If no, it indicates that the data variance is too large, and thus a general write operation, instead of the data patch write operation, is performed to write data into the data block (step S6-5). If the result in step S6-4 is yes, a judgment is made to check whether the total length of the patch records is zero or not (in step S6-6). If yes, it means the new data is the same as the old data, and thus there is no need to perform a write operation. If no, it is continued to determine whether there is any space in the corresponding patch area to store the patch records (step S6-7). If no, the corresponding patch area is exhausted and a general write operation is performed (step S6-5), instead of a data patch write operation. If the result in step S6-7 is yes, the patch records will be written into the patch area (step S6-8) to complete the write operation.

By means of the aforementioned data read and write flowchart, it can only record the difference in the patch area when writing data to the flash memory and the data variance being small. Therefore, the whole data is not required to be written to the flash memory, and thus the number of erasing to the flash memory is significantly reduced, so as to extend the lifetime of the flash memory.

Figure 7:
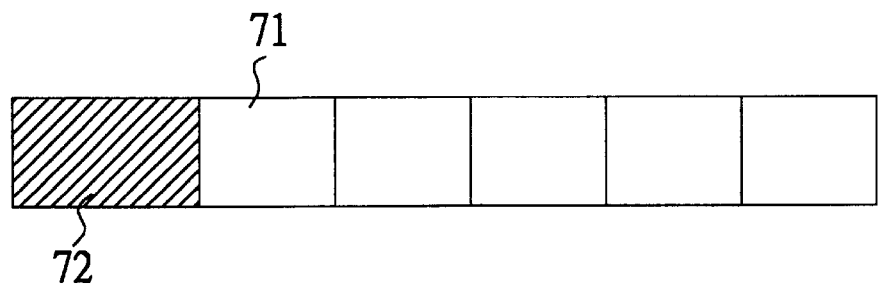
FIG. 7 shows a flash memory structure in accordance with another preferred embodiment of the present invention.

FIG. 7 shows a flash memory structure of another preferred embodiment of the present invention. In the embodiment, the size of the segment 71 of the flash memory is set to have the same length as the data block (for example, 512 byte); that is, every segment is also a data block. In front of multiple data blocks, there is a patch area 72 to record the variance of those data blocks. With such a structure, the aforementioned read and write flowchart can also be applied thereto, so as to reduce the number of erasing to the flash memory and to extend the lifetime of the flash memory.

Figure 8:
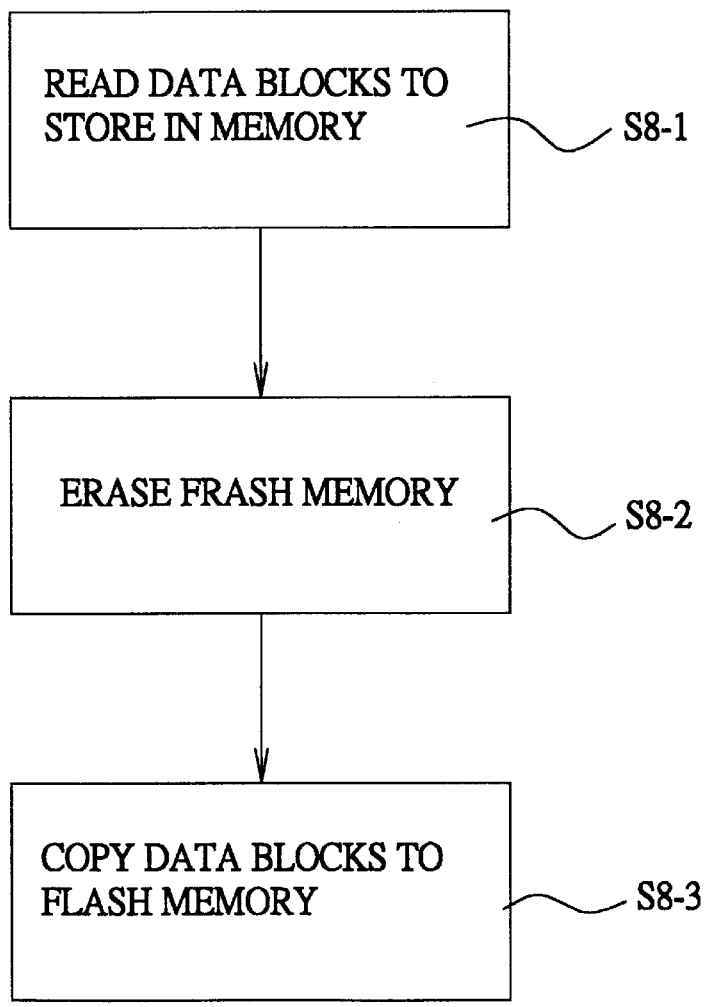
FIG. 8 is a flowchart of segment callback in accordance with the present invention.
Figure 9:
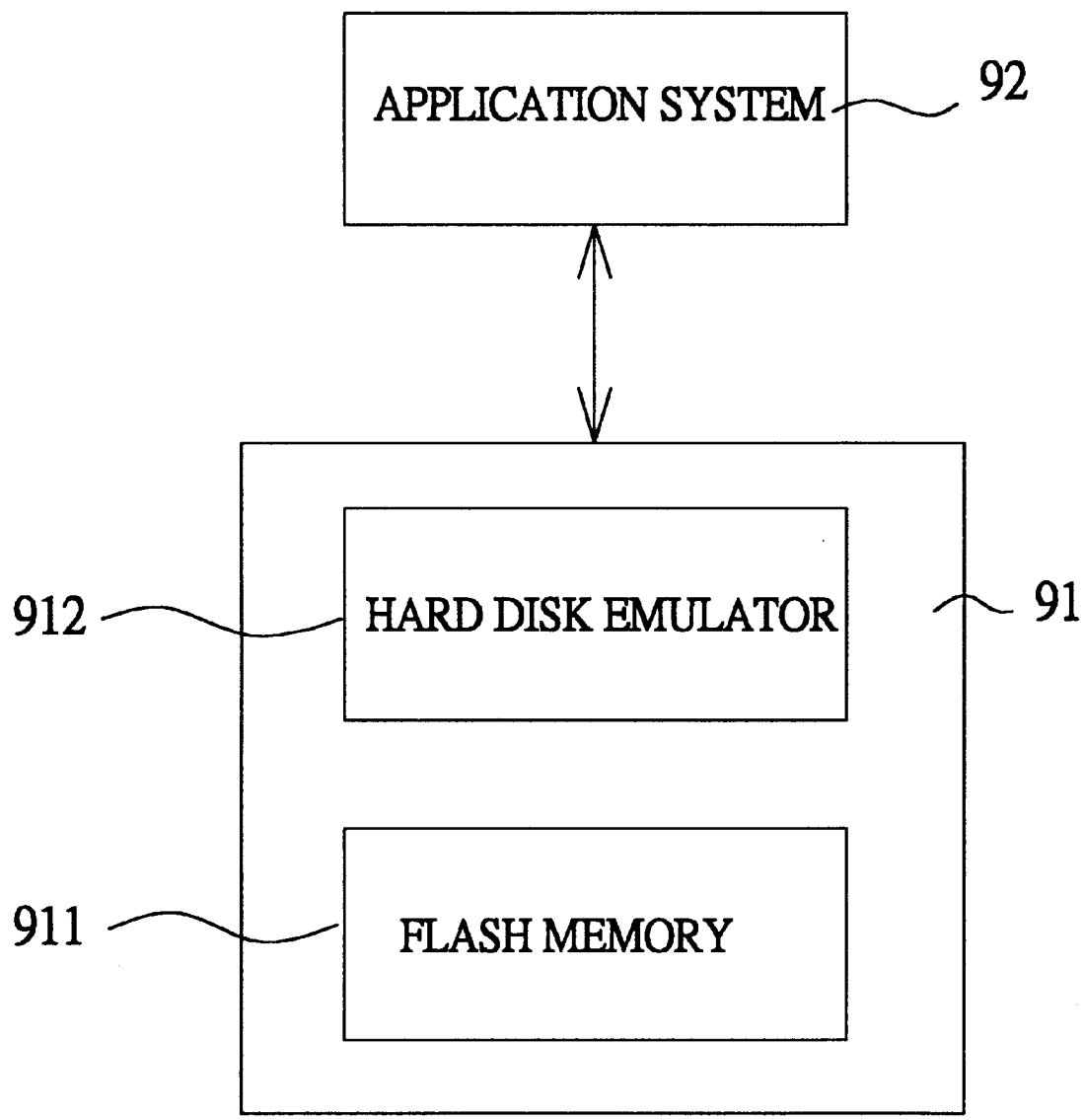
FIG. 9 schematically illustrates an emulation hard disk drive constituted by flash memory.

In addition, after many times of read and write operations have been performed in accordance with the present invention, some void data blocks may be produced and the patch area will get small. Therefore, it needs to perform a segment callback procedure to recycle the void blocks and clear the patch area to get best performance in use of the flash memory. FIG. 8 shows a flowchart of segment callback in accordance with the present invention. First, based on the aforementioned data patch manner, the data blocks, which are still in use but can't be written anymore, are read out and patched by the corresponding patch record in the patch area for being temporarily stored in memory (step S8-1). Then, the content in the segments of the flash memory can be erased (step S8-2), so as to clear all data blocks and patch area for being written again. Finally, the data which is temporarily stored in memory, is copied to the data blocks of the flash memory (step S8-3) for being used again, and the previous void data blocks can be reused to achieve an enhanced performance in using the flash memory.

Although the present invention has been explained in relation to its preferred embodiment, it is to be understood that many other possible modifications and variations can be made without departing from the spirit and scope of the invention as hereinafter claimed.

What is claimed is:

1. A data access method for reducing the number of erasing to flash memory comprising:
   a data write procedure for determining a difference between data to be written and existed data in the data block when writing data to a data block of the flash memory, and if the difference is less than a predetermined value, writing the difference to a patch area instead of writing the data to the data block; and
   a data read procedure for searching the difference recorded in the patch area when reading data from a data block of the flash memory, so as to patch the data.

2. The data access method for reducing the number of erasing to flash memory as claimed in claim 1, wherein in the data write procedure, at least a patch record is produced by comparing the data to be written and the existed data on the data block.

3. The data access method for reducing the number of erasing to flash memory as claimed in claim 2, wherein, when the patch area has enough space and the patch record has a total length smaller than a threshold value, the patch record is written into the patch area.

4. The data access method for reducing the number of erasing to flash memory as claimed in claim 3, wherein, if the patch area does not have enough space, a general flash memory write operation is performed to write the data to the data block.

5. The data access method for reducing the number of erasing to flash memory as claimed in claim 2, wherein, when the patch record has a total length greater than a threshold value, a general flash memory write operation is performed to write the data to the data block.

6. The data access method for reducing the number of erasing to flash memory as claimed in claim 2, wherein, when the patch record has a total length of zero, no substantial write operation is performed.

7. The data access method for reducing the number of erasing to flash memory as claimed in claim 3, wherein, in the data read procedure, a corresponding patch record is found in the patch area, so as to patch the data based on the patch record.

8. The data access method for reducing the number of erasing to flash memory as claimed in claim 3, further comprising a data segment callback procedure to recycle void data blocks.

9. The data access method for reducing the number of erasing to flash memory as claimed in claim 8, wherein the data segment callback procedure comprising the steps of:

reading data blocks which is still in use based on the data read procedure for being temporarily stored in memory;

erasing content of the segment of the flash memory; and copying the data block which is temporarily stored in memory back to the data block of the flash memory.

10. A data patch and access device for reading and writing flash memory, the flash memory having multiple data blocks, at least a data block corresponding to a patch area, the device comprising:

a data write means for determining a difference between data to be written and existed data in the data block when writing data to a data block of the flash memory, and if the difference is less than a pre-determined value, writing the difference to a patch area instead of writing the data to the data block; and a data read means for searching the difference recorded in the patch area when reading data from a data block of the flash memory, so as to patch the data.

11. The data patch and access device as claimed in claim 10, wherein the data write means produces at least a patch record by comparing the data to be written and the existed data on the data block.

12. The data patch and access device as claimed in claim 10, wherein, when the patch area has enough space and the patch record has a total length smaller than a threshold value, the data write means writes the patch record into the patch area.

13. The data patch and access device as claimed in claim 12, wherein, if the patch area does not have enough space, the data write means performs a general flash memory write operation to write the data to the data block.

14. The data patch and access device as claimed in claim 2, wherein, when the patch record has a total length greater than a threshold value, the data write means performs a general flash memory write operation to write the data to the data block.

15. The data patch and access device as claimed in claim 11, wherein, when the patch record has a total length of zero, the data write means does not perform any substantial write operation.

16. The data patch and access device as claimed in claim 12, wherein, the data read means finds a corresponding patch record in the patch area, so as to patch the data based on the patch record.

17. The data patch and access device as claimed in claim 10, further comprising a data segment callback means to recycle void data blocks.

18. The data patch and access device as claimed in claim 17, wherein the data segment callback means performs the following steps:

reading data blocks which is still in use based on the data read procedure for being temporarily stored in memory;

erasing content of the segment of the flash memory; and copying the data block which is temporarily stored in memory back to the data block of the flash memory.

* * * * *